(12) United States Patent
Yang et al.

(10) Patent No.: US 8,319,303 B2
(45) Date of Patent: Nov. 27, 2012

(54) METHOD AND SYSTEM OF EMBEDDED MICROLENS

(75) Inventors: Jianping Yang, Shanghai (CN); Herb Huang, Shanghai (CN); JieGuang Huo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/987,930

(22) Filed: Jan. 10, 2011

(65) Prior Publication Data
US 2012/0012960 A1  Jan. 19, 2012

(30) Foreign Application Priority Data
Jan. 12, 2010 (CN) .......................... 2010 1 0022718

(51) Int. Cl.
*H01L 31/0232* (2006.01)
(52) U.S. Cl. .. 257/432; 257/436; 257/443; 257/E31.127
(58) Field of Classification Search .................. 257/432, 257/436, 443, E31.127
See application file for complete search history.

(56) References Cited

U.S. PATENT DOCUMENTS

| | | | |
|---|---|---|---|
| 5,239,412 A | 8/1993 | Naka et al. | |
| 5,796,154 A | 8/1998 | Sano et al. | |
| 5,965,875 A | 10/1999 | Merrill | |
| 6,362,498 B2 | 3/2002 | Abramovich | |
| 7,029,944 B1 * | 4/2006 | Conley et al. | 438/69 |
| 7,557,337 B2 * | 7/2009 | Jiang et al. | 250/216 |
| 2004/0080006 A1 * | 4/2004 | Yamamoto | 257/432 |
| 2005/0242271 A1 * | 11/2005 | Weng et al. | 250/214.1 |
| 2011/0233704 A1 * | 9/2011 | Yokozawa | 257/432 |

* cited by examiner

*Primary Examiner* — Long Pham
(74) *Attorney, Agent, or Firm* — Kilpatrick Townsend & Stockton LLP

(57) ABSTRACT

An image sensor includes an array of photo-sensing regions formed in a semiconductor substrate, a dielectric layer over the array of photo-sensing regions, and an array of microlenses formed in the dielectric layer. Each of the microlenses is center-aligned over one of the photo-sensing regions and has a truncated plano-convex shape. The microlenses have an index of refraction that is higher than the dielectric layer's refraction index. Each of the microlenses has a smooth circular top, a flat circular bottom, and a curved circumferential side convex towards the semiconductor substrate.

20 Claims, 6 Drawing Sheets

METHOD AND SYSTEM OF EMBEDDED MICROLENS

CROSS-REFERENCES TO RELATED APPLICATIONS

This application claims priority to Chinese Patent Application No. 201010022718.2, filed Jan. 12, 2010, which is commonly owned and incorporated by reference herein for all purposes.

BACKGROUND OF THE INVENTION

Embodiments of the present invention relate to integrated circuits and the processing for the manufacture of semiconductor devices. More particularly, embodiments of the present invention provide structures of an embedded microlens that can be made and packaged easily and methods for making such structures. The microlens according to embodiments of the present invention can be applied to charge-coupled devices (CCDs), color CMOS image sensors, contact image sensors, and others. But it would be recognized that the invention has a much broader range of applicability. For example, the invention can be applied to make a variety of photometric devices and distance measuring devices containing microlens to increase the amount of light impinging on a photo-sensing element and to improve its sensitivity.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit in photo-electronic IC fabrication, such as image sensors, is the ability to make microlenses properly to increase the amount of light impinging on the photo-sensing pixel as the pixel side is decreased for achieving better image resolution.

As merely an example, a conventional microlens fabrication process is often performed after the silicon processing and often performed in conjunction with a color filter coating. After the formation of R, G, B color filters, a layer of planarization coating is often applied before a microlens coating material is applied thereon. Subsequently, photolithography and thermal curing processes are performed to form the microlens. This conventional approach, wherein microlenses are formed on top of the color filters, requires separate material and lithography processing, and non-standard packaging methods due to the existence of an air gap for facilitating proper focusing of incident light beams. Additionally, the microlenses, which typically include resin, are formed at relatively low temperature (about 200° C.). The low temperature process may limit the use of the microlenses in high-temperature soldering applications.

From the above, it is seen that improved techniques for forming microlenses are desired.

BRIEF SUMMARY OF THE INVENTION

Embodiments of the present invention relate to integrated circuits and the processing for the manufacture of semiconductor devices. More particularly, embodiments of the present invention provide methods and structures for making an embedded microlens for integrated photoelectronic devices. But it would be recognized that the invention has a much broader range of applicability. For example, the invention can be applied to make a variety of charge-coupled devices and CMOS image sensors containing microlenses.

A specific embodiment of the invention provides a method of making an embedded microlens. The method provides a substrate including at least one photo-sensing region. The method further forms a dielectric film overlying the substrate. The dielectric film has a first index of refraction. The method additionally forms a mask layer overlying the dielectric film, the mask layer includes a patterned opening. In an embodiment, the patterned opening is circular-shaped and is center-aligned over the at least one photo-sensing region. Additionally, the method etches the dielectric film to form a cavity under the mask layer by introducing an isotropic etchant through the opening. The cavity is characterized by a truncated plano-convex shape with a flat circular bottom and convex peripheral walls curved towards the dielectric film. The method further removes the mask layer and deposits a lens material having a second index of refraction over the dielectric film and fills at least partially the cavity. The second index of refraction is higher than the first index of refraction. Moreover, the method planarizes the lens material to form a microlens in the cavity with a smooth top surface. The method further includes forming a color filter layer over the top surface of the microlens.

In an embodiment, the photo-sensing region includes a photodiode. In another embodiment, the dielectric film includes a light transparent material having a refractive index of about 1.5 or smaller. In an embodiment, the second index of refraction is equal to about 2.0 and higher. In another embodiment, the mask layer may include a phootresist material. In an embodiment, the circular opening includes an area that is smaller than the photo-sensing region.

Another specific embodiment of the invention provides a method of forming an embedded microlens array. The method includes providing a substrate having an array of photo-detectors, depositing a transparent film overlying the photo-detector array, and forming a mask layer overlying the transparent film. Additionally, the method includes forming multiple circular openings in the mask layer. Each of the openings is center-aligned over one photo-detector. The method further includes etching the transparent film to form a plurality of cavities under the mask layer by introducing an isotropic etchant through the openings. Each cavity is characterized by a truncated plano-convex shape with a flat circular bottom and curved peripheral walls convex towards the transparent film. Moreover, the method includes removing the mask layer and wet-dipping around a peripheral rim of each cavity to form a soft curved rim surface. The method further includes depositing a lens material comprising silicon nitride, zirconium oxide, hafnium oxide, or zinc oxide overlying the transparent film and filling at least partially the cavities. Furthermore, the method includes planarizing the lens material to form a microlens array having a smooth top surface wherein each microlens is embedded in one truncated plano-convex shaped cavity. The method further includes forming a color filter layer overlying the top surface of the microlens array. In an embodiment, the array of photo-detectors receives an incident light through the color filter layer and the microlens array and converts the incident light to an electrical signal. In an embodiment, the array of photo-detectors may be associated with a color CMOS image sensor, a charge-coupled device, or a contact image sensor. In another embodiment, the transparent film comprises silicon dioxide having a refractive index of about 1.5 or smaller, and the lens material includes a refractive index equal to or greater than 2.0.

In yet another specific embodiment of the invention, an image sensor device includes an array of photo sensors formed in a semiconductor substrate. Additionally, the image sensor device includes a first dielectric layer overlying the array of photo sensors. The first dielectric layer has a thickness, a first index of refraction, and a surface. Moreover, the image sensor device includes an array of microlenses embedded in the surface. Each of the microlenses is center-aligned over one of the photo sensors and has a truncated plano-convex shape. The microlens may be formed from a second dielectric material having a second index of refraction that is higher than the first index of refraction. The image sensor device further includes a color filter layer overlying the array of microlenses. In an embodiment, the semiconductor substrate includes a back-end-of-line processed silicon wafer, an SOI substrate, a quartz substrate, a ceramic substrate, or a glass substrate. In an embodiment, the first dielectric layer includes silicon dioxide or polyimide having an index of refraction equal to or less than 1.5. In another embodiment, the truncated plano-convex shape is curved towards the first dielectric layer.

Embodiments of the present invention provide many benefits over conventional techniques. For example, embodiments of the present invention provide an easy to use process that is much simplified with less processing steps in photolithography and polishing and is thus more cost effective than the conventional microlens fabrication process. In some embodiments, the present invention provides a method for forming the microlens that does not depend on thermal curing. A wide variety of lens materials, instead of a limited selection of lens materials suitable for low-temperature processing in conventional art, allows a flexible choice of packaging, including those designed for high-temperature soldering. Additionally, the present invention provides an improved microlens design using a dry-wet combination etching in addition to a chemical-mechanical planarization process to enhance the performance of an imaging sensor. The novel truncated plano-convex shape of the microlens and the short distance between the microlens and the photo sensing region help to alleviate oblique light beam problems. Moreover, embodiments of the present invention provide a process that can be integrated in the established silicon wafer back-end-of-line (BEOL) processing. In a specific embodiment, the integrated microlens fabrication can be particularly useful for contact image sensor (CIS) applications. Depending upon the embodiment, one or more of these benefits may be achieved. These and other benefits will be described in more details throughout the present specification and more particularly below.

BRIEF DESCRIPTION OF THE DRAWINGS

Various additional embodiments, features and advantages of the present invention can be more fully appreciated with reference to the detailed description and accompanying drawings, in which.

DETAILED DESCRIPTION OF THE INVENTION

Figure 1:
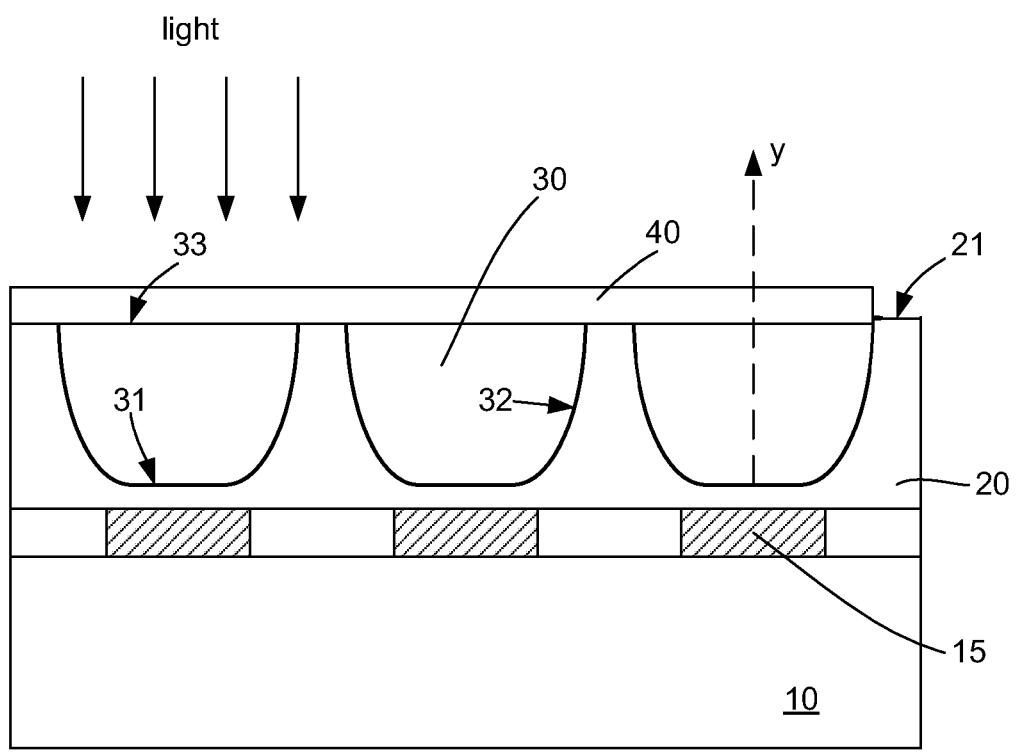
FIG. 1 is a simplified cross-sectional view diagram showing an image pixel including an embedded microlens structure over a photo-sensing region according to an embodiment of the present invention.

Embodiments of the present invention relate to integrated circuits and the processing for the manufacture of semiconductor devices. More particularly, embodiments of the present invention provide methods and structures for making an embedded microlens for integrated photo-electronic devices. But it would be recognized that the invention has a much broader range of applicability. For example, embodiments of the present invention can be applied to a variety of charge-coupled devices and CMOS image sensors containing microlens and contact image sensor (CIS) applications.

A conventional microlens fabrication process is often performed after the silicon processing or on a finished silicon wafer. Typically, microlenses are formed after the formation of color filters. The conventional process requires that a coating material be applied on the color filter layer and that the coating material be planarized prior to the deposition of the lens material. Multiple separate photolithography and polishing processes are then required to form a lens. The lens is then reshaped by a thermal curing process. Such conventional approach often requires the lens material, which is typically made of resin, to be formed at relatively low temperature (about 200° C.). The low temperature process prevents the microlens to be used in packages with high soldering temperature. Due to the formation of the microlens over the color filter layer, an air gap may be needed to facilitate proper focusing of incident light beams, which also requires the use of high cost non-standard packaging methods. Additionally, a large spacing between the conventional microlens and the photo-sensing element may generate an inaccurate image due to possible loss of light signal with oblique incident angles.

One embedded microlens process (U.S. Pat. No. 6,362,498) had been proposed to make a microlens below the color filter layer by etching a silicon nitride film on a finished silicon wafer in combination with a heating-process treated photo resist to form the microlens. This approach requires multiple separate processes for photo masking, resist coating, and etching, and does not have a cost advantage comparing with the conventional color filter process.

Embodiments of the present invention provide a more cost effective microlens fabrication process that can be integrated in the silicon wafer back-end-of-line (BEOL) processing steps. The formation of microlens does not depend on thermal curing and allows a choice of a wide variety of materials for the lens without having the subsequent packaging issue that requires a high temperature processing. The embedded microlens is located below the color filter layer and is much closer to the photo-sensing region, reducing the image distortion problem caused by oblique light beams. At the end of the microlens process, a flat finished surface is ready for color filter process, which would save a planarization processing step used in conventional approaches described above.

FIG. 1 schematically shows an embedded microlens within an image sensor pixel according to an embodiment of the present invention. This diagram is merely an example, which should not unduly limit the scope of the claims herein. One of ordinary skill in the art would recognize many variations, alternatives, and modifications.

As shown in FIG. 1, the sensor pixel is build on a substrate 10 which may be a BEOL processed silicon wafer with a photo-sensing region 15 and a transistor device (not shown) built therein. According to some embodiments, the substrate may include a suitable material for forming or supporting one or more photo-sensing regions 15. For example, the substrate 10 can be an SOI substrate, a quartz substrate, a ceramic substrate, or a glass substrate.

Referring to FIG. 1, the photo-sensing region 15 may include a plurality of photosensitive elements, for example, CCD camera pixels; color photo sensors, photo emissive elements, or photodiodes. In an embodiment, the photo-sensing region 15 occupies approximately ⅓ or less than of the area of a sensor pixel. A dielectric film stack 20 is deposited over the substrate 10. For example, the dielectric film stack 20 is used, in part, as a light transparent media, in part as a dielectric burying layer for interconnect metals for photodiode-transistor devices among pixels, and in part as a lens embedding material. One or more microlenses 30 are embedded within the dielectric film stack 20 and center-aligned over the photo-sensing region 15 (indicated by the axis y). According to an embodiment of the present invention, the microlens 30 is a truncated plano-convex lens having a planar circular top 33, a flat circular bottom 31 and a soft curved peripheral wall 32 convex towards the dielectric film stack. In an example embodiment, the flat circular bottom 31 has a radius approximately equal to one fourth to one half of the radius of the planar circular top surface 33 of the microlens 30. In an embodiment, the circular top and the flat circular bottom are substantially parallel to each other, and the convex wall is interposed between the planar circular top and the flat circular bottom. The microlens 30 preferably includes a light transparent material having a refractive index higher than that of the dielectric film stack 20 according to an embodiment of the present invention. In an example embodiment, the dielectric film stack 20 includes silicon oxide having a refractive index about 1.5 or less, the microlens 30 includes silicon nitride having a refractive index of 2.0. In other embodiment, the microlens may include zirconium oxide having a refractive index of 2.5.

According to an embodiment, the resin, which is typically used as a conventional lens material, is not used here for the microlens. Accordingly, the cumbersome thermal curing process for forming the lens is not required. Furthermore, less restriction is imposed in the selection of device packaging as high-temperature (>200° C.) soldering packages can be used. According to another embodiment, the truncated plano-convex shape of the microlens with a high refractive index produces a focusing effect for light beams, whose incident angle is perpendicular to the surface 33, to reach the photo-sensing region 15 below. Unlike conventional approaches, an embodiment of the present invention provides a reduced distance between the microlens 30 and the photo-sensing region 15. The truncated plano-convex lens with a flattened bottom 31 directs incident light beams near the central area of the microlens 30 to a wide area of the photo-sensing region 15 and the soft curved convex wall 32 of the microlens 30 provides proper focus effect to direct the light beams that impinge at the vicinity of the lens edges.

Figure 2A:
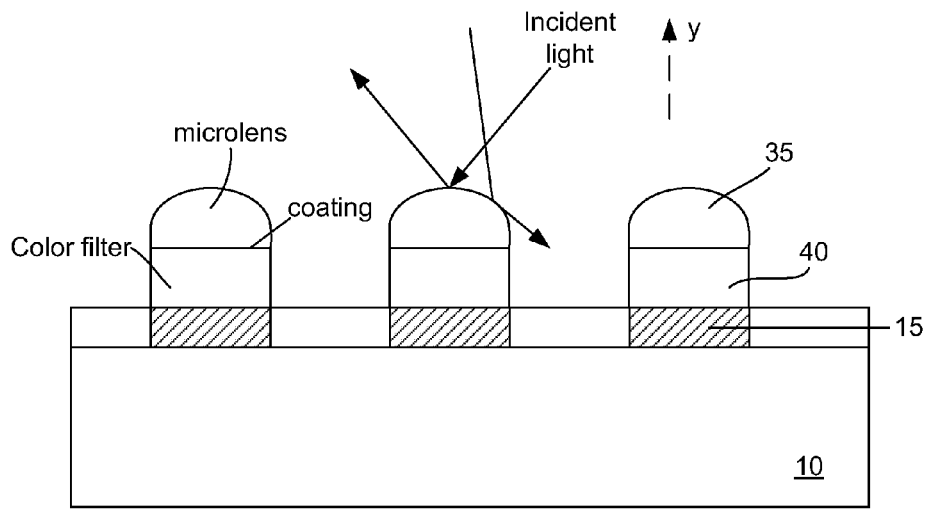
FIG. 2A is a simplified cross-sectional view diagram showing the oblique light problem that exists in a conventional image sensor.

In the case where the incident light beams may strike the microlens at oblique incident angle, conventional solid state image devices are not designed to properly handle the oblique light beams. FIG. 2A shows a conventional image sensor containing a plano-convex shaped lens 35. The light beams reaching the surface of the lens with an oblique incident angle (deviated from the perpendicular direction represented by dashed line y) may be refracted away from the photo-sensing region 15. The other problem may be the large distance between the microlens 35 and the photo-sensing region 15 caused by an interposing color filter 40.

Figure 2B:
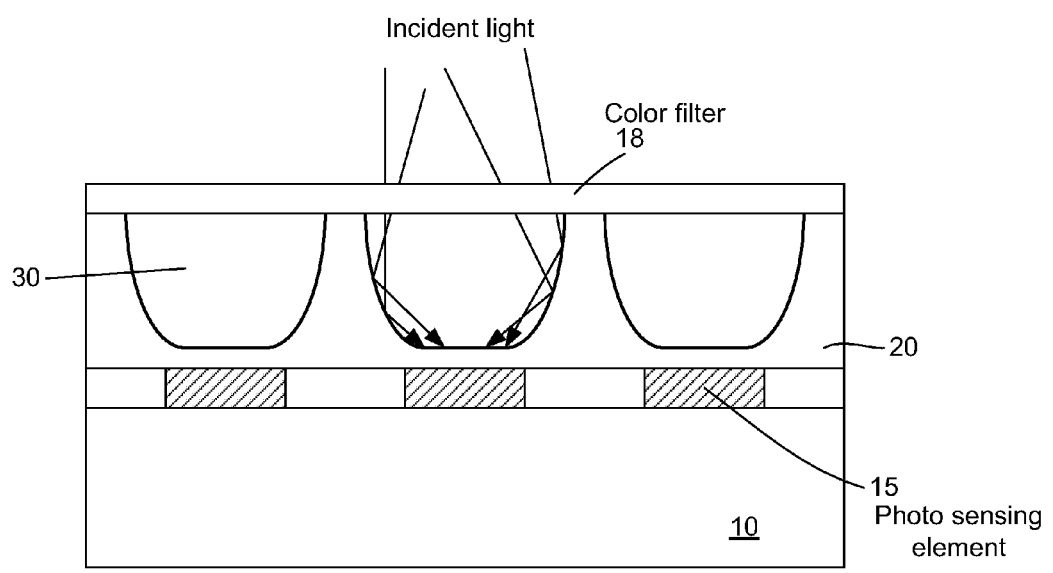
FIG. 2B is a simplified cross-sectional view diagram showing the embedded microlens structure that reduces or avoids the oblique light problem according to one embodiment of the present invention.

FIG. 2B shows an improved focusing effect for the same oblique light beams according to a specific embodiment of the present invention. The improvement is achieved, in part, due to the reduced distance between the microlens 30 and the photo-sensing region 15 because the color filter 18 is located above the microlens 30. The novel structure of the truncated plano-convex lens shape refracts the oblique light beams towards the photo-sensing region, in part, because microlens 30 has a refractive index larger than the refractive index of air or any protective layer above. Although the flattened central bottom does not provide a focusing effect, its small area relative to the photo-sensing region and the close distance between the microlens 30 and the photo-sensing region 15 make it non critical for incident light receiving by the photo sensing region 15. According to some embodiments of the present invention, an embedded microlens having a refractive index higher than the refractive index of the dielectric layer can be made for an image sensor that offers better sensitivity and performance than conventional ones. Embodiments of the present invention provide methods for controlling a proper thickness of the dielectric film stack 20, the geometrical shape of the truncated plano-convex microlenses 30, and the spacing between the microlenses 30 and photo-sensing regions 15 to reduce or eliminate problems related to oblique incident light beams. It will be shown in sessions below that embodiments of the present invention provide microlens structures that are simple to be manufactured and process steps that are simple and easy to be controlled.

Referring back to FIG. 1, the planar top surface 33 of the microlens 30 is co-planar with the surface 21 of the dielectric film stack 20 according to an embodiment of the present invention. In a specific embodiment, a color filter layer 40 is added over the planar top surface of the microlens for a color image sensor. In an example embodiment, the color filter layer 40 is formed from known negative photoresist materials based on an acrylic polymer including dyed red, green, blue (RGB) or cyan, magenta, and yellow (CMY) colored pigments. With the plano-convex shape lens design based on an embodiment of the present invention, the planarization process is performed only at the top surface of the lens material and dielectric film, saving at least one planarization process in prior arts approach. In one embodiment, the addition of the color filters overlying the co-planarized surfaces 33 and 21 makes the microlenses 30 fully embedded. In another embodiment, an anti-reflection coating may be added overlying the planar top surface 33 of the microlens 30 prior to the formation of the color filter layer 40. In another embodiment for the contact image sensor (CIS) application, when color filters are not required, the embedded microlens fabrication according to some embodiments of the present invention can be easily integrated with established silicon wafer process wherein R, G, B color sensors have been formed within the photo-sensing region 15 in the substrate. In this case, for example, the anti-reflection coating is directly applied on the co-planar surfaces 33 and 21 as a protection layer for the embedded microlenses. The anti-reflection coating has a lower refractive index than that of the microlens. In an exemplary embodiment, the refractive index of the anti-reflection coating equals the square root of the refractive index of the microlens to improve the light collection efficiency of the image sensor.

As shown in FIG. 1, each sensor pixel includes a microlens associated with a photo-sensing region. The microlens is used to increase the amount of light impinging onto the photo-sensing region. The incident light is then converted to an electric signal at the photo-sensing region through photo-electron emission and detection, and is further processed through a charge-transfer and amplification by a transistor device coupled to the photo-sensing region. The electric signal of the image sensors is then used to generate an optical image on, for example, a display device. For each image pixel, the photo-sensing region typically occupies about ⅓ or less of the total pixel area.

A method of making an embedded microlens according to an embodiment of the present invention may be outlined as follows:

1. Provide a substrate having a photo-sensing region;
2. Form a dielectric film stack overlying the photo-sensing region;
3. Form a photoresist layer having a patterned opening overlying the dielectric film;
5. Perform wet etch through the patterned opening to form a convex-shaped cavity in the dielectric film;
6. Strip the photoresist layer to reveal a surface of the dielectric film;
7. Deposit a high refractive index lens material on the surface of the dielectric film and fill the cavity;
8. Planarize the lens material to form an embedded microlens having a smooth top surface that is co-planar with the surface of the dielectric film; and
9. Form a color filter layer overlying the co-planar surface of the embedded microlens.

The above sequence of steps provides a method of making an embedded microlens according to an embodiment of the present invention. As shown, the method uses a combination of steps including a way of forming an improved microlens for image sensing applications. Other alternatives can be provided where steps are added, one or more steps removed, or one or more steps are provided in a different sequence without departing from the scope of the claims herein. Further details of the present method can be found throughout the present specification and more particularly below.

Figure 3:
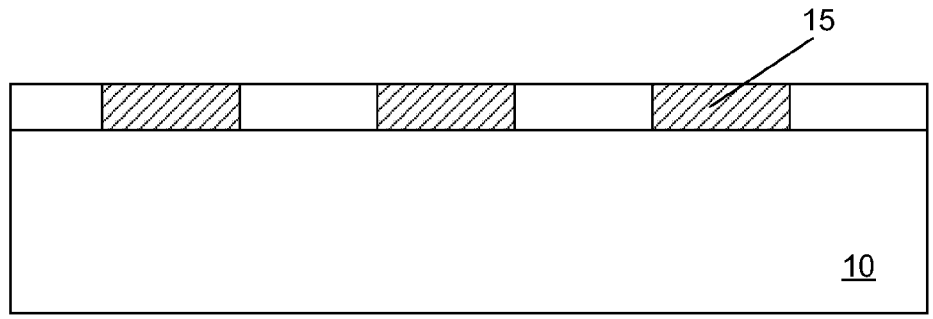
FIGS. 3 through 9 are simplified cross-sectional view diagrams showing a method of making embedded microlens structures according to some embodiments of the present invention.

FIGS. 3 through FIG. 9 are simplified diagrams illustrating methods of making an embedded microlens for image sensing applications according to an embodiment of the present invention. These diagrams are merely examples, which should not unduly limit the scope of the claims herein. One of ordinary skill in the art would recognize many variations, modifications, and alternatives. In an embodiment of the present invention, a microlens fabrication method is integrated in the silicon wafer BEOL processing steps. As shown in FIG. 3, the method provides a substrate 10, and forms a plurality of photo-sensing regions 15 in the substrate. In an embodiment, each of the photo-sensing regions 15 includes a photodiode. In an example embodiment, the photodiode is fabricated using known techniques and has desired photo-electron emission properties for a particular sensing application, and each photodiode occupies about ⅓ or less of the area of a pixel. In another embodiment, each photo-sensing region 15 is electrically coupled with a charge transfer circuit or a transistor device within the pixel. The charge-transfer circuit or the transistor device, not shown in FIG. 3, can be formed using known techniques in the substrate prior to the silicon wafer BEOL process.

Figure 4:
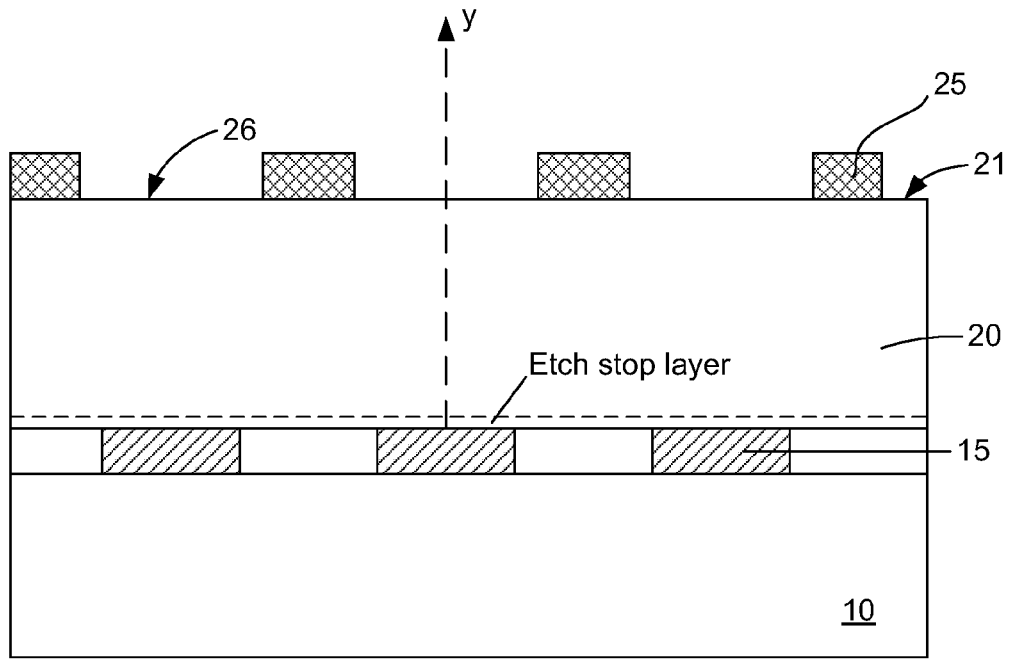

Referring to FIG. 4, a transparent dielectric film stack 20 is deposited over the photo-sensing regions 15 within the silicon BEOL wafer substrate 10. In a specific embodiment, a passivation layer may be added prior to the deposition of the dielectric film stack 20. In an example embodiment, the passivation layer can be a silicon dioxide layer which is typically utilized in CMOS fabrication processes to form a protective layer. In an embodiment, the dielectric film stack 20 is made of silicon oxide that has a refractive index about 1.5 or less. In another embodiment, the dielectric film stack 20 is a multi-layer film having a variable refractive index that is a function of the film thickness. For example, the refractive index may be controlled by mixing an amount of impurity material such as nitrogen ion or metal particles in some sub-layers of the dielectric film stack 20. In another embodiment, the variable refractive index may provide an improved light focusing effect, compensating the function of the microlens that is to be embedded therein. In an embodiment, the dielectric film stack 20 can also be used as a dielectric bury layer for interconnect metals which connects the photo-sensing region and transistor region among image pixels. In still another embodiment, the dielectric film stack 20 has a suitable thickness to accommodate the embedded microlens having a proper thickness therein. In an embodiment, the suitable thickness provides a necessary thickness to form a target focal length of the lens, and to provide a burying layer for other interconnect metals.

Referring still to FIG. 4, the method forms a mask layer 25 over the dielectric film stack 20. In one embodiment, the mask layer 25 is a photoresist layer deposited over the surface 21 of the dielectric film stack 20. As shown, openings 26 are patterned into the photoresist layer 25. The patterned openings 26 are used to introduce a wet etchant for etching the dielectric film stack 20. In one embodiment, the openings 26 are circular shaped and center-aligned over the corresponding photo-sensing regions 15, indicated by the perpendicular central axis y. The size of the opening 26 may affect the shape of the microlens formed in later process steps and may be empirically determined based on the size of the photo-sensing region 15 in the image pixel and the target focal length. According to some embodiments of the present invention, the size of the opening 26 is to be smaller than the photo-sensing region 15, but not too small to allow etchant to flow through. The size of the openings may be further adjusted based on the results from the etching process to be performed and the lens material to be used subsequently. In another embodiment, the openings 26 are formed by using dry etching on the hard mask layer 25. For example, this etching process is a highly anisotropic plasma assisted etching. In another example, an etch stop layer patterned to align the photo-sensing region below has been applied prior to the opening-making dry-etch process so that no dielectric film stack material is removed.

Figure 5:
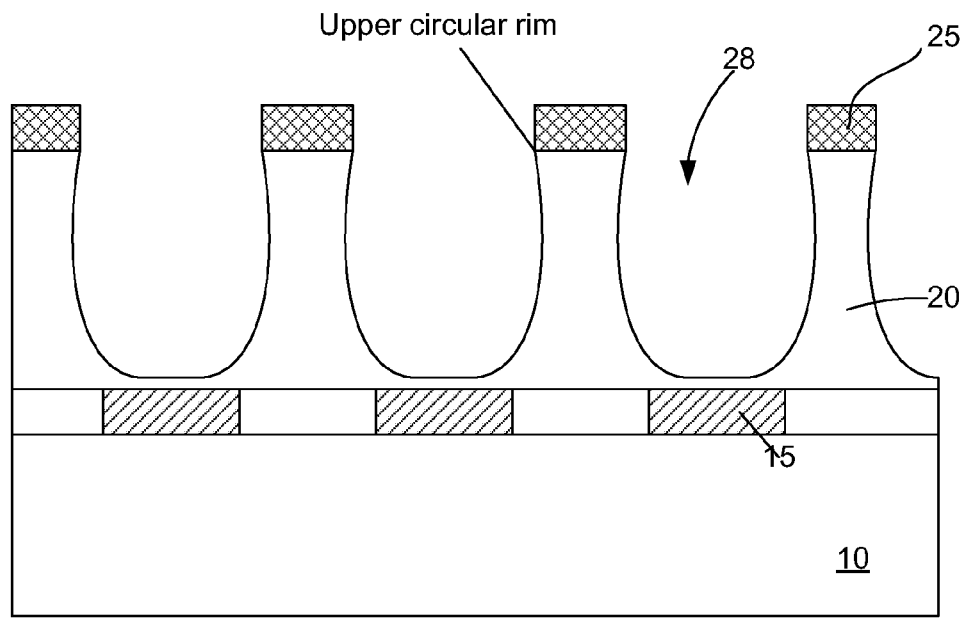

Next, an isotropic wet etch is performed by introducing an etchant through the openings 26 to etch the dielectric film stack 20 below the mask layer 25. As shown in FIG. 5, the opening 26 provides a 2D circular source of etchant. Therefore the isotropic etching based on the 2D circular source of etchant leads to a truncated plano-convex shaped cavity 28, which has a flattened circular bottom surrounded by a quarter-spherical sides and a circular upper rim with a larger radius than the circular bottom. In one embodiment, because of the isotropic etching, the radius of the circular flat bottom is correlated to the size of the opening 26 and the center of the circular flat bottom is substantially aligned with the center of the opening 26. The radius of the upper circular rim and the thickness of the cavity are determined by the etch rate and etch time. In an example embodiment, the selection of the etchant can be a buffered hydrofluoric acid (HF) if the dielectric film stack includes silicon dioxide. In another example, other etchants such as a mixture of nitric acid or hydrofluoric acid may be used. According to some embodiments of the present invention, the exact shape of the cavity 28 may be slightly varied due to different sizes of openings 26 and different etchants used with different etching rates for various dielectric film stack materials. For example, the etchant solution composition and etching time can be empirically used for process control. Once the process conditions are optimized for a particular image sensor application, this etch step will provide an initial shape of the cavity that may determine the form of the embedded microlens.

Figure 6:
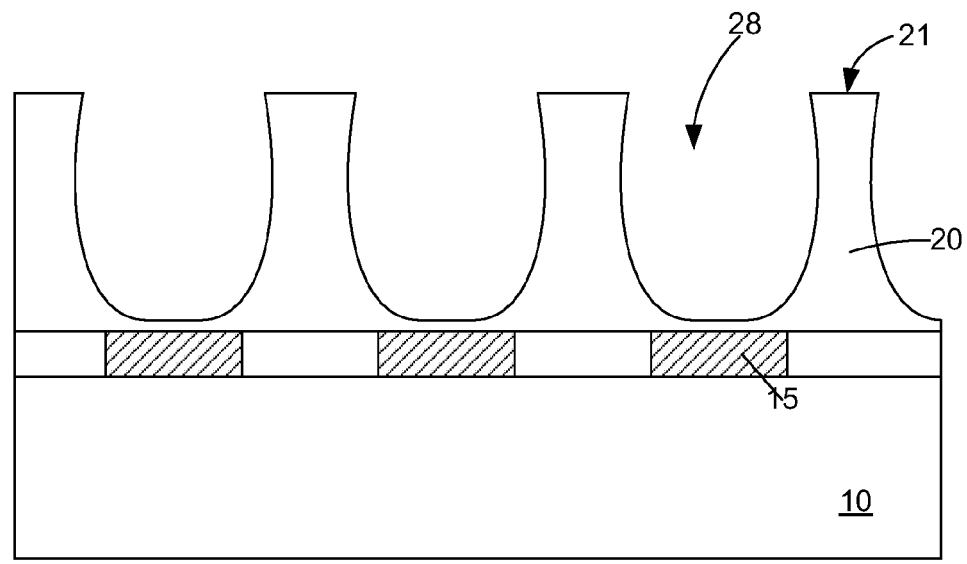

Once the initial shape of the truncated plano-convex cavity 28 has been formed, the mask layer 25 is then removed, leaving the cavity 28 and the surface 21 of the dielectric film stack exposed as shown in FIG. 6. Furthermore, a wet HF dip process is performed near the circular upper rim area of the cavity 28 according to an embodiment of the present invention. In one embodiment, this wet-dip process aims to provide a soft curvature of the convex sides near the rim area of the cavity 28. The criteria of a successful wet-dip process is to eliminate the total reflection effect for the light beams hitting at the convex curved sides. In another embodiment, the wet-dip process results in a bigger radius for the upper rim of the cavity 28.

Figure 7:
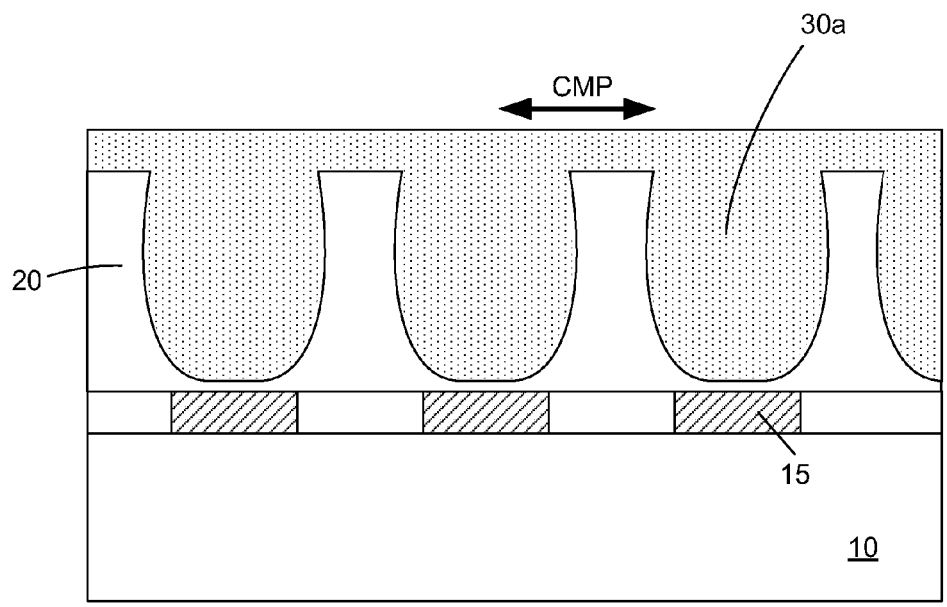

Subsequently, as shown in FIG. 7, a lens material 30*a* is deposited to fill the cavity 28. In one embodiment, if sufficient amount of the lens material 30*a* is deposited, the lens material naturally takes on the shape of the cavity 28 to form an interface between the lens material 30*a* and the dielectric film stack 20. In other words, the interface possesses a flat circular central area surrounded by curved peripheral sides convex towards the dielectric film stack 20. Extra lens material may cover the surface 21 of the dielectric film stack 20. In another embodiment, the lens material 30*a* is preferably selected from dielectric materials with a refractive index that is higher than that of the dielectric film stack 20. Thus, incident light beams that pass through the lens material 30*a* into the dielectric film stack 20 will be concentrated, not diffused, onto the photo-sensing region 15 located a short distance underneath. For example, if the transparent dielectric film stack 20 is made of silicon dioxide which has a refractive index about 1.5 or less, the lens material 30*a* then should have a refractive index equal to or greater than 2.0. In another example, the lens material 30*a* is silicon nitride $Si_3N_4$ having a refractive index of 2.0. In yet another example, zirconium oxide $ZrO_2$ which has a refractive index of 2.5 can be used as the lens material. Other lens materials such as $HfO_2$, $TiO_2$, $Al_2O_3$, $ZnO_2$ etc. with a refractive index about 2.0 or higher may also be used. In another embodiment, the lens material 30*a* may be deposited using known techniques such as a PVD process, a CVD process, a spin-on process, etc. These lens materials, unlike traditional one such as resin, no longer need the thermal curing process and can sustain high-temperature (>200° C.) processing encountered in standard packaging.

Figure 8:
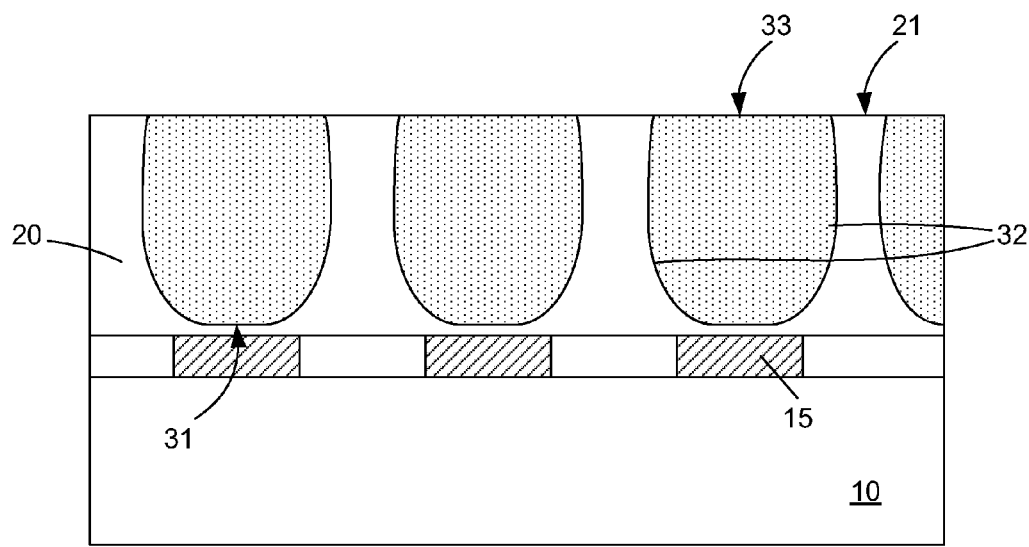

After the lens material 30*a* is deposited and the cavity 28 is filled, a planarization process is performed. In one embodiment, a chemical mechanical polishing (CMP) process is used to planarize the deposited lens material 30*a*. In one embodiment, the CMP process removes extra lens materials and continues until the top surface 33 of the lens material is co-planar with the surface 21 of the dielectric film stack. The microlens 30 is formed with its final shape being finalized by this CMP process. The microlens 30 formed in the cavity has a planarized top surface 33 and a truncated convex bottom including a flat circular bottom 31 surrounded by soft-curved peripheral sides 32 convex towards the dielectric film stack 20, as shown in FIG. 8. In a specific embodiment, the thickness of the microlens 30 may be further reduced by extending the CMP process to lower the level of co-planar surfaces 33 and 21. This also results in a bigger radius of circular top surface 33, which can be approximately 2 to 4 times larger than the radius of flat circular bottom 31. In another embodiment, the CMP process is used to achieve a desired or optimum convex edge curvature, a top surface size, and a thickness for the final microlens structure which will most effectively direct the light beams hitting the pixel to the photo-sensing region 15.

According to an embodiment of the present invention, the flat circular bottom 31 of the microlens 30 does not provide focusing effect to the impinging light beams in that area. However, because the photo-sensing region 15 is not a point detector but a plurality of sensing elements distributed in a finite area (less than ⅓ of each pixel physical size), perfect focusing for the lens is unnecessary. In addition, the distance between the microlens 30 over the photo-sensing region 15 can be greatly reduced based on some embodiments of the present invention. In one specific embodiment, the flat circular bottom 31 of the microlens 30 advantageously direct impinging light beams to a wider range of the photo-sensing region 15 instead of focusing to a relatively small portion of sensing elements. In another embodiment, the soft-curved peripheral sides 32 ensure that the light beams hitting the convex curved sides can be properly focused onto the photo-sensing region 15. In an specific embodiment, a combination of wet-dipping and CMP process helps to turn the steep slopes of the initial shape to a soft curvature, eliminating the total-reflection effect to the light beams hitting near the rim edge of the microlens 30 and increasing the amount of light sensed. The process parameters can be controlled based on specific requirements for achieving optimum thickness, radius of top surface, and curvature of the peripheral sides of the final lens shape. Once the optimum conditions are determined, the CMP process can be fixed as needed.

Figure 9:
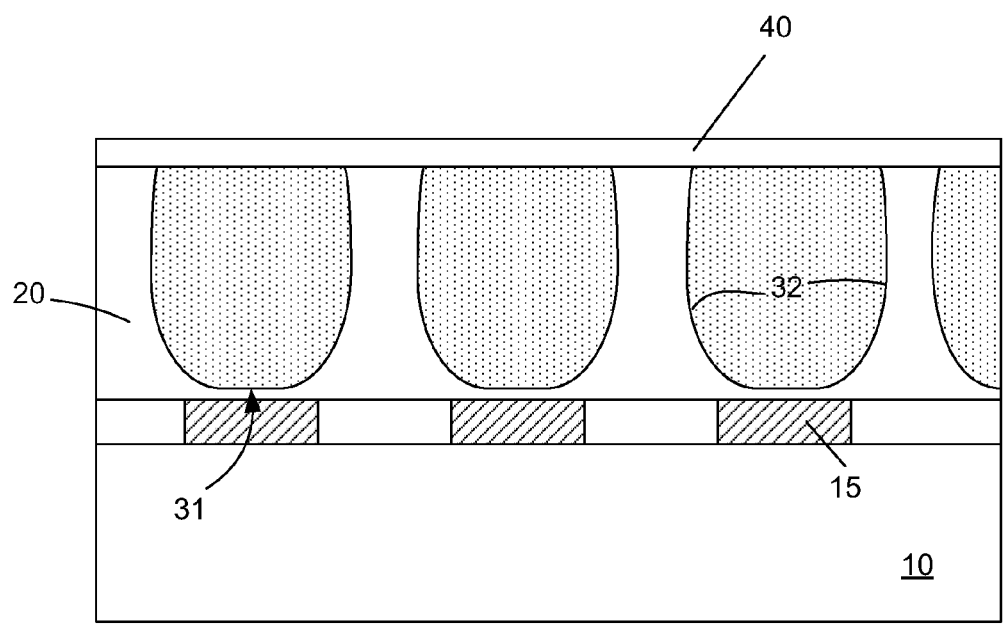

According to an embodiment of the present invention, the CMP process not only defines the final shape of the microlenses 30 but also form a co-planar surface of the microlenses 30 and the dielectric film stack 20 for a subsequent color filter process. In an example embodiment, a protective layer including an anti-reflection layer may be directly applied to the co-planar surfaces of microlenses 30 and dielectric film stack 20 for black-and-white image sensors or CCDs. In another example embodiment, a color filter layer 40, according to an embodiment as shown in FIG. 9, may be directly applied over the co-planar surfaces of the microlenses 30 and the dielectric film stack 20 for color image sensor applications. In yet another example embodiment, the color filter layer 40 is formed using known negative photoresist materials based on an acrylic polymer including dyed red, green, blue (RGB) or cyan, magenta, and yellow (CMY) colored pigments. In another embodiment, the deposition of the photo-resist film can be performed by standard spin-on coating techniques. In an exemplary embodiment, the thickness of the color filter layer 40 can be in the range of 0.7 to 1.5 microns.

In yet another embodiment, a color transparent coating or an anti-reflection layer may often be applied over the color filter layer 40 to seal and protect the color filter layer (not shown in FIG. 9).

A method of making an embedded microlens according to an alternative embodiment of the present invention for a CIS application may be outlined as follows:

1. Provide a substrate with an RGB color sensing region;
2. Form a dielectric film stack overlying the RGB color sensing region;
3. Form a mask layer overlying the dielectric film;
4. Dry etch to form a patterned opening in the mask layer;
5. Wet etch through the patterned opening to form a plano convex-shaped cavity in the dielectric film;
6. Strip the mask layer to expose a surface of the dielectric film;
7. Deposit a high refractive index lens material on the surface of dielectric film and fill the cavity;
8. Planarize the lens material to form the embedded microlens with a smooth top surface which is co-planar with the surface of the dielectric film; and
9. Form an anti-reflection coating overlying the co-planar surface of the embedded microlens and the surface of the dielectric film.

The above sequence of steps provides a method according to an embodiment of the present invention. As shown, some embodiments of the method use a combination of steps including a way of forming an improved microlens for a contact image sensor application. Other alternatives can be provided where steps are added, one or more steps removed, or one or more steps are provided in a different sequence without departing from the scope of the claims herein.

Note that since the embedded microlens structures based on some embodiments of the present method are formed directly over the photo (or color) sensing region, there is no need to provide a separate layer, or to transfer the lens structure by etching or CMP process or reposition it. The co-planar surfaces of the transparent dielectric film stack and the embedded microlens provide a natural base for the color filter layer and eliminate thus extra planarization or lithography and etching processes.

Some embodiments of the present invention provide a method of making an embedded microlens array over an image sensor array. The method includes producing a substrate including an array of photo-sensing elements. The photo-sensing elements may include photodiodes, color sensors, or CCD camera pixels. Additionally, the method includes depositing a transparent dielectric film overlying the array of photo-sensing elements, forming a mask layer overlying the transparent film, and forming an array of circular openings in the mask layer. Each of the openings is center-aligned over one of the photo-sensing elements. The method further includes etching the transparent film to form an array of cavities under the mask layer by introducing an isotropic etchant through the array of openings. Each cavity is characterized by a truncated plano-convex shape having a flat circular bottom and curved peripheral sides convex towards the transparent film. Moreover, the method includes removing the mask layer and wet-dipping around the peripheral rim of each cavity to form soft curved sides. The method further includes depositing a lens material comprising silicon nitride, zirconium oxide, hafnium oxide, titanium dioxide, aluminum ocide, or zinc oxide overlying the transparent film and at least partially filling the array of cavities and planarizing the lens material to form a microlens array having a smooth top surface; each microlens being in a cavity having the truncated plano-convex shape. The method further includes forming a color filter layer overlying the top surface of the microlens array.

Some embodiments of the present invention provide an image sensor device. The image sensor device includes an array of photo sensing portions formed in a semiconductor substrate. Additionally, the image sensor device includes a first dielectric layer overlying the array of photo sensing portions. The first dielectric layer has a first index of refraction and includes a thickness and a surface. Moreover, the image sensor device includes an array of microlenses embedded in the surface. Each of the microlenses is center-aligned over one of the photo sensing portions and has a truncated plano-convex shape. The microlens is formed from a second dielectric material having a second index of refraction that is higher than the first index of refraction. The image sensor device further includes a color filter layer overlying the co-planar surface of the array of microlenses and the first dielectric layer. The image sensor device may include a CMOS image sensor array, a CCD array, or a contact image sensor array.

In general, embodiments of the present invention provide many advantages. Some embodiments of the present invention provide a novel process of making microlenses for image sensor applications by forming embedded microlenses directly over photo-sensing regions within the pixel. For example, the distance between the microlens and the photo-sensing region may be greatly reduced without much process and physical burden to reduce the oblique light beam problems. Some embodiments of the present invention provide a method of making a novel truncated plano-convex shaped microlens for better directing the impinging light beams to the photo-sensing regions even with oblique angles. Additionally, embodiments of the present invention allow the use of a wide variety of lens materials that do not have the limitation related to thermal curing to form microlenses and can stand for high-temperature processing based on the standard packaging technology. Some embodiments of the present invention also provide cost effective methods of making embedded microlenses that can be easily integrated in the silicon wafer back-end-of-line processing steps. For example, no separate photomask, resist coating, and etching are required for making both the microlenses and the color filter layer. The CMP process to planarize the co-planar surfaces of the transparent dielectric film stack and the microlenses embedded therein provides a direct base for forming color filters overlying the microlenses. Finally, the present invented method of making embedded microlens structure provides no little limits for scaling down the pixel size and improving the resolution of image sensors.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An image sensor device comprising:
an array of photo sensing portions formed in a semiconductor substrate;
a first dielectric layer overlying the array of photo-sensors, the first dielectric layer having a first index of refraction and including a surface;
an array of microlenses embedded in-the first dielectric layer, each of the microlenses being center-aligned over one of the array of photo sensing portions and having a truncated plano-convex shape, the microlenses being formed from a second dielectric material having a second index of refraction; and a color filter layer overlying the array of microlenses;

wherein the truncated plano-convex shape includes a circular top having a smoothtop surface, a flat circular bottom, and a curved circumferential side convex towards the semiconductor substrate.

2. The image sensor device of claim 1 further comprising a plurality of charge transfer circuits formed in the semiconductor substrate, each of the charge transfer circuits being coupled to each of the array of photo sensors.

3. The image sensor device of claim 1, wherein each of the array of photo-sensors comprises a CCD camera pixel, a photodiode, or an RGB color sensor element.

4. The image sensor device of claim 1, wherein the semiconductor substrate comprises a back-end-of-line processed silicon wafer, an SOI substrate, a quartz substrate, a ceramic substrate, or a glass substrate.

5. The image sensor device of claim 1, wherein the first dielectric layer comprises silicon dioxide or polyimide with index of refraction equal to or slightly less than 1.5.

6. The image sensor device of claim 1, wherein the first dielectric layer comprises a thickness capable of forming embedded microlenses having a predetermined focal length.

7. The image sensor device of claim 1, wherein the second dielectric material is selected from the group consisting of silicon nitride, titanium oxide, zirconium oxide, hafnium oxide, and zinc oxide.

8. The image sensor device of claim 1, wherein the second dielectric material comprises an index of refraction about 2.0 or higher.

9. The image sensor device of claim 1, wherein the circular top comprises a diameter that is equal to or slightly less than a distance between the center of any two adjacent microlenses.

10. The image sensor device of claim 1, wherein the circular top of each of the microlenses is co-planar with the surface of the first dielectric layer.

11. The image sensor device of claim 1, wherein the flat circular bottom comprises a diameter that is about ¼ to ½ of the circular top's diameter.

12. The image sensor device of claim 1, wherein the circular bottom is separated from the array of photo sensing portions by the first dielectric layer.

13. The image sensor device of claim 1, wherein the color filter layer comprises a negative photoresist based on an acrylic polymer including color pigments.

14. The image sensor device of claim 13, wherein the color pigments comprise red, green, blue (RGB) or cyan, magenta, and yellow (CMY) dyed polymers.

15. The image sensor device of claim 1, wherein the color filter layer comprises an index of refraction smaller than the second index of refraction.

16. The image sensor device of claim 1 further comprising an anti-reflection coating interposed between the microlenses and the color filter layer.

17. The image sensor device of claim 1, wherein the first dielectric layer comprises a multi-layer film having a variable refractive index.

18. The image sensor device of claim 17, wherein the first dielectric layer comprises a material containing nitrogen ions or metal particles.

19. The image sensor device of claim 1, wherein the first index of refraction is lower than the second index of refraction.

20. The image sensor device of claim 1, wherein the color filter layer has a thickness in a range from 0.7 to 1.5 microns.

* * * * *